(12) United States Patent
Costello et al.

(10) Patent No.: US 11,503,732 B1
(45) Date of Patent: Nov. 15, 2022

(54) SOCKET ALIGNMENT AND RETENTION SYSTEM

(71) Applicant: TE Connectivity Services GmbH, Schaffhausen (CH)

(72) Inventors: Brian Patrick Costello, Scotts Valley, CA (US); Christopher William Blackburn, Bothell, WA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 13 days.

(21) Appl. No.: 17/246,085

(22) Filed: Apr. 30, 2021

(51) Int. Cl.
*H05K 7/10* (2006.01)
*H01R 13/05* (2006.01)
*H01R 13/11* (2006.01)
*H01R 13/629* (2006.01)

(52) U.S. Cl.
CPC ........... *H05K 7/1084* (2013.01); *H01R 13/05* (2013.01); *H01R 13/11* (2013.01); *H01R 13/629* (2013.01); *H05K 7/1092* (2013.01); *H05K 2201/10189* (2013.01); *H05K 2201/10318* (2013.01); *H05K 2201/10325* (2013.01)

(58) Field of Classification Search
CPC ...... H05K 7/1084; H01R 13/05; H01R 13/11; H01R 13/629
USPC .......................................................... 439/65
See application file for complete search history.

(56) References Cited

U.S. PATENT DOCUMENTS

| | | | | |
|---|---|---|---|---|
| 4,617,708 A * | 10/1986 | Fanning | .................... | H05K 9/00 29/25.42 |
| 6,556,455 B2 * | 4/2003 | Dibene, II | .......... | H01R 12/7088 257/E23.09 |
| 6,847,529 B2 * | 1/2005 | Dibene, II | ........... | H05K 7/1092 257/E23.09 |
| 7,257,004 B2 * | 8/2007 | Costello | ................. | H05K 1/141 174/16.3 |
| 7,489,514 B2 * | 2/2009 | Hamasaki | ............ | G02B 6/3817 361/801 |
| 7,535,090 B2 * | 5/2009 | Furuyama | ............ | H05K 1/0268 257/685 |
| 7,881,072 B2 * | 2/2011 | Dibene, II | ............. | H01R 12/52 361/784 |
| 7,963,775 B2 * | 6/2011 | Reisinger | ........... | H01R 12/7082 439/82 |
| 7,983,048 B2 * | 7/2011 | Sasaki | .................. | H01L 23/3677 174/16.3 |
| 8,373,428 B2 * | 2/2013 | Eldridge | ............ | G01R 31/2884 324/754.14 |

(Continued)

*Primary Examiner* — Alexander Gilman

(57) ABSTRACT

An electronic module includes a module substrate has an upper surface and a lower surface. The module substrate has a package pad array having package contact pads at the upper surface. The module substrate has a socket pad array having socket contact pads at the upper surface. The module substrate has guide pin locating pads associated with the socket pad array. The electronic module has an electronic package coupled to the package contact pads at the package pad array. The electronic module has guide pins surface mounted to the guide pin locating pads. The electronic module has a socket assembly coupled to the module substrate. The socket assembly has a socket housing holding socket contacts. The socket contacts are coupled to the socket contact pads at the socket pad array. The socket frame including pockets receiving the guide pins to locate the socket assembly relative to the module substrate.

20 Claims, 9 Drawing Sheets

(56) References Cited

U.S. PATENT DOCUMENTS

| | | | | |
|---|---|---|---|---|
| 9,466,545 | B1* | 10/2016 | Scanlan | H01L 25/03 |
| 9,543,703 | B2* | 1/2017 | Horchler | H01R 13/05 |
| 9,613,841 | B2* | 4/2017 | Rathburn | H01L 23/49811 |
| 11,129,290 | B2* | 9/2021 | Costello | G06F 1/182 |
| 2002/0081911 | A1* | 6/2002 | Endres | H01R 12/7011 |
| | | | | 439/717 |
| 2003/0057548 | A1* | 3/2003 | Hartke | H01R 4/64 |
| | | | | 257/718 |
| 2003/0201462 | A1* | 10/2003 | Pommer | G02B 6/4259 |
| | | | | 257/200 |
| 2003/0214800 | A1* | 11/2003 | Dibene, II | H01R 12/52 |
| | | | | 257/E23.09 |
| 2004/0218372 | A1* | 11/2004 | Hamasaki | H05K 1/0263 |
| | | | | 361/767 |
| 2006/0067031 | A1* | 3/2006 | Crane, Jr. | H01G 4/35 |
| | | | | 257/E23.079 |
| 2009/0065918 | A1* | 3/2009 | Murphy | H01R 12/7076 |
| | | | | 257/686 |
| 2014/0217571 | A1* | 8/2014 | Ganesan | H01L 23/49811 |
| | | | | 257/693 |
| 2016/0183374 | A1* | 6/2016 | Prakash | H01L 23/498 |
| | | | | 361/767 |
| 2019/0148858 | A1* | 5/2019 | Mason | H01R 13/111 |
| | | | | 439/67 |
| 2019/0170809 | A1* | 6/2019 | Walls | G01R 1/06722 |
| 2019/0306985 | A1* | 10/2019 | Ferguson | H01R 12/88 |
| 2020/0295483 | A1* | 9/2020 | Costello | H05K 1/117 |
| 2020/0375053 | A1* | 11/2020 | Costello | H05K 7/1084 |
| 2021/0119361 | A1* | 4/2021 | Perry | H01R 12/52 |
| 2021/0194164 | A1* | 6/2021 | Epitaux | H01R 13/631 |
| 2021/0274673 | A1* | 9/2021 | Blackburn | H05K 7/1084 |
| 2022/0151095 | A1* | 5/2022 | Blackburn | H05K 3/368 |

* cited by examiner

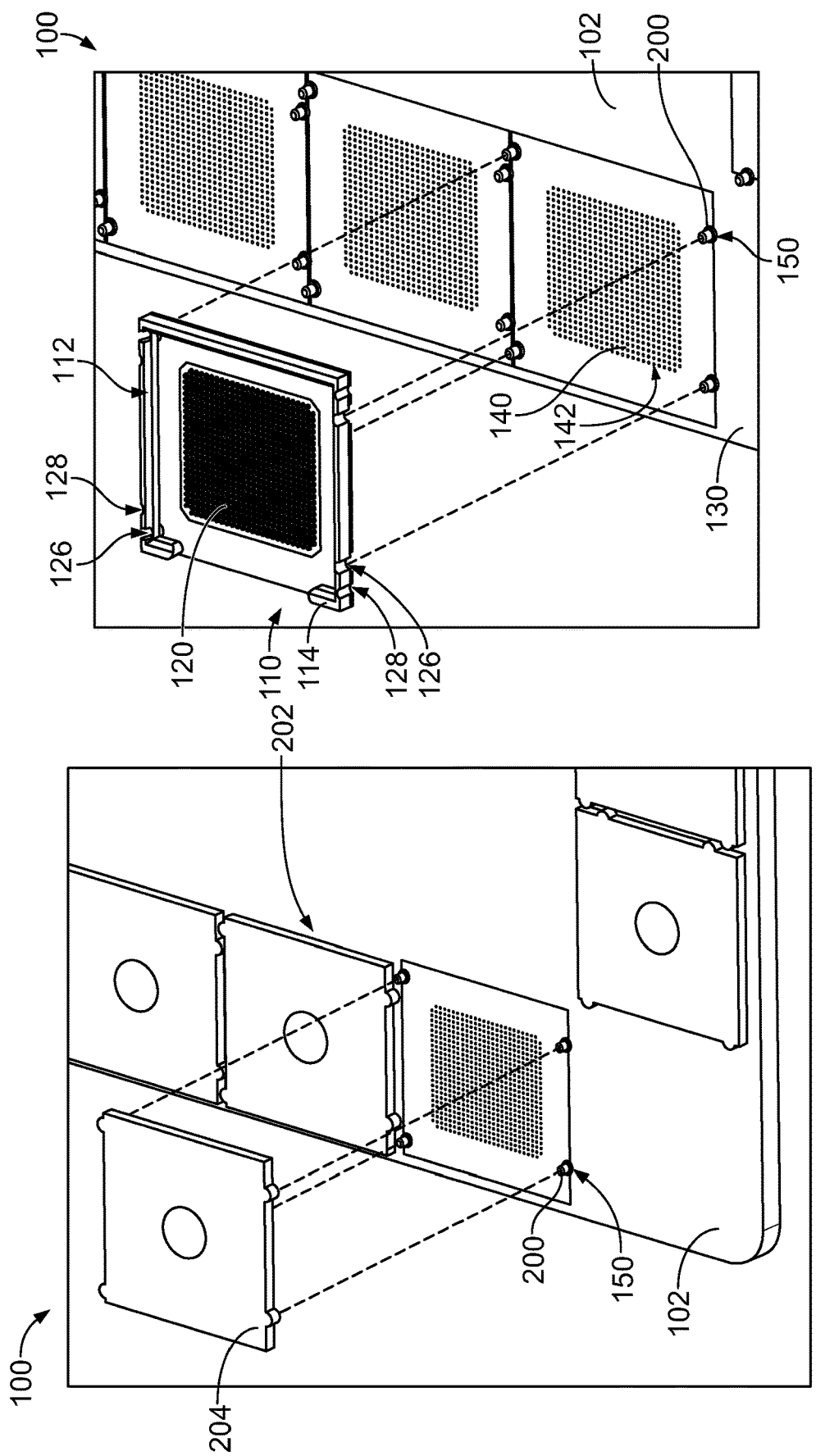

_US 11,503,732 B1_

SOCKET ALIGNMENT AND RETENTION SYSTEM

BACKGROUND OF THE INVENTION

The subject matter herein relates generally to data communication systems.

Electrical interconnects are used to connect two opposing electronic devices. For instance, electrical interconnects may be provided between two circuit boards or a circuit board and another electronic device or pluggable module to transmit data and/or power therebetween. Some known electrical interconnects are surface mountable with an array of contacts having separable mating interfaces for repeated mating and unmating rather than by soldering the contacts to the components. As the size of components decreases, the components have tighter manufacturing tolerances. It is difficult to properly align the components during manufacture and assembly. Some known systems use guide posts that extend into openings between the components to align the components. For example, openings are provided in the circuit board that received guide posts that extend from the electrical interconnect to position the electrical interconnect relative to the circuit board. However, for some systems, providing openings or holes through the circuit board is undesirable. For example, the holes make circuit trace routing difficult or require additional layers in the circuit board for trace routing. Additionally, adding the holes in a separate drilling process may lead to diminished tolerance control in the overall system, which may lead to improper mating of the components.

A need remains for an interconnect system that can accommodate the high component density and positioning of components in a reliable manner.

BRIEF DESCRIPTION OF THE INVENTION

In one embodiment, an electronic module is provided and includes a module substrate has an upper surface and a lower surface. The module substrate has a package pad array having package contact pads at the upper surface. The module substrate has a socket pad array having socket contact pads at the upper surface. The module substrate has guide pin locating pads associated with the socket pad array. The electronic module has an electronic package coupled to the package contact pads at the package pad array. The electronic module has guide pins surface mounted to the guide pin locating pads. The electronic module has a socket assembly coupled to the module substrate. The socket assembly has a socket housing holding socket contacts. The socket contacts are coupled to the socket contact pads at the socket pad array. The socket frame including pockets receiving the guide pins to locate the socket assembly relative to the module substrate.

In another embodiment, an electronic module is provided and includes a module substrate that has an upper surface and a lower surface. The module substrate has a package pad array having package contact pads at the upper surface. The module substrate has a socket pad array having socket contact pads at the upper surface. The module substrate has guide pin locating pads associated with the socket pad array. The electronics module includes an electronic package coupled to the package contact pads at the package pad array. The electronics module includes a guide pin carrier assembly coupled to the module substrate. The guide pin carrier assembly includes a carrier that has guide pin pockets at predetermined locations relative to each other corresponding to locations of the guide pin locating pads. The guide pin carrier assembly includes guide pins received in the corresponding guide pin pockets. The guide pins are surface mounted to the guide pin locating pads. The carrier is removable from the guide pins after the guide pins are surface mounted to the guide pin locating pads.

In a further embodiment, an electronic assembly is provided and includes a host circuit board having an upper surface and a lower surface. The host circuit board includes board contacts on the upper surface. The electronic assembly includes a socket connector coupled to the host circuit board. The socket connector includes a connector housing holding connector contacts. The connector contacts are coupled to the board contacts. The electronic assembly includes an electronic module coupled to the socket connector. The electronic module includes a module substrate having an upper surface and a lower surface. The module substrate has a package pad array having package contact pads at the upper surface. The module substrate has a socket pad array having socket contact pads at the upper surface. The module substrate has guide pin locating pads associated with the socket pad array. The electronic module includes an electronic package coupled to the package contact pads at the package pad array. The electronic module includes guide pins surface mounted to the guide pin locating pads. The module substrate has a socket assembly coupled to the module substrate. The socket assembly has a socket housing holding socket contacts. The socket contacts are coupled to the socket contact pads. The socket frame includes pockets. The pockets receiving the guide pins to locate the socket assembly relative to the module substrate.

BRIEF DESCRIPTION OF THE DRAWINGS

FIG. 11 is a top perspective view of a portion of the electronic module in accordance with an exemplary embodiment.

FIG. 12 is a top perspective view of a portion of the electronic module in accordance with an exemplary embodiment.

DETAILED DESCRIPTION OF THE INVENTION

Figure 1:
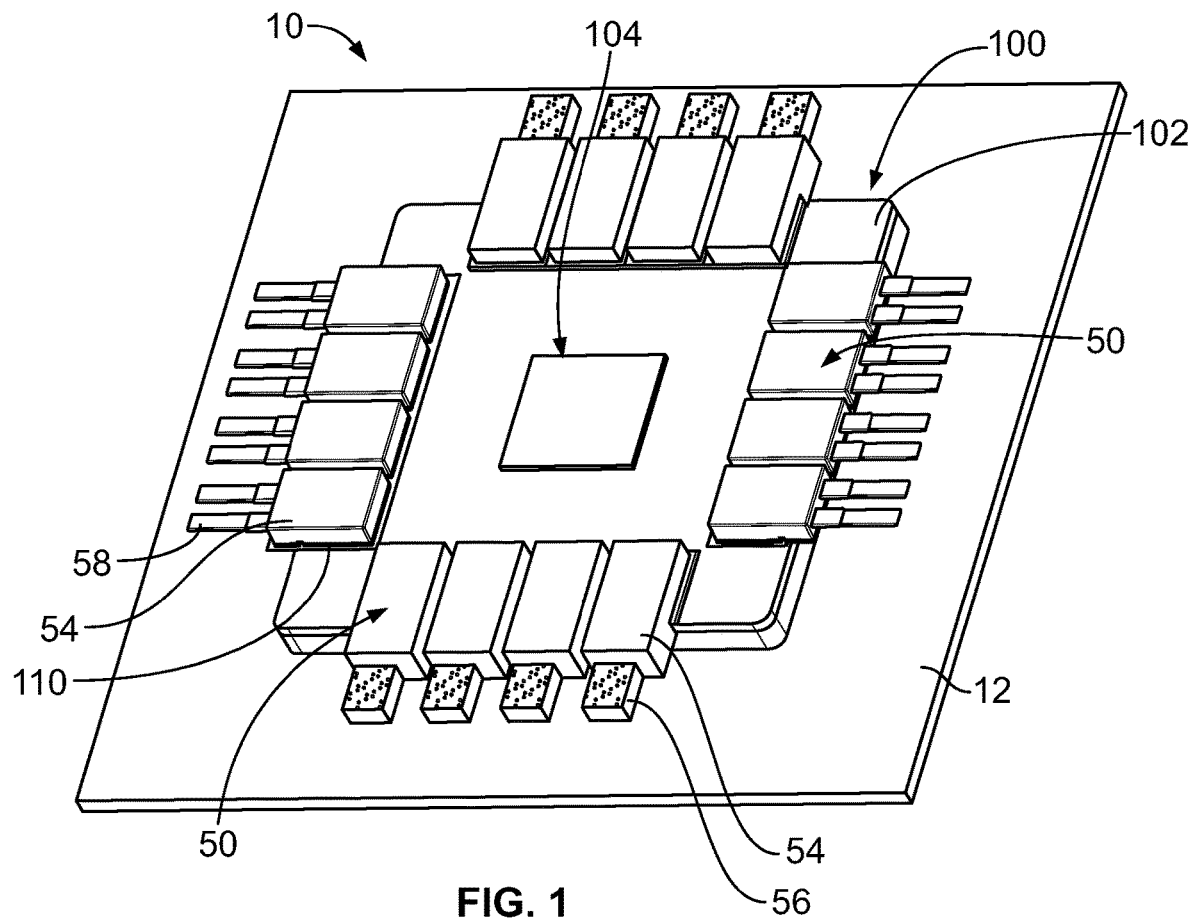
FIG. 1 illustrates an electronic assembly including an electronic module in accordance with an exemplary embodiment.
Figure 2:
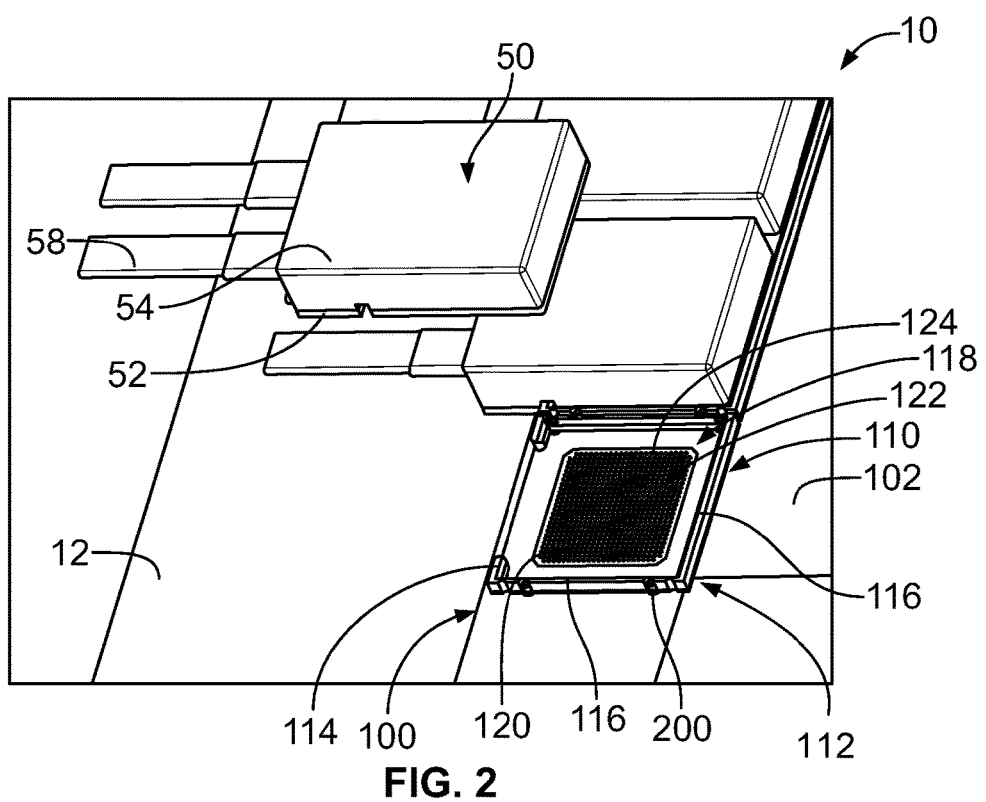
FIG. 2 illustrates a portion of the electronic assembly in accordance with an exemplary embodiment.

FIG. 1 illustrates an electronic assembly 10 including an electronic module 100 in accordance with an exemplary embodiment. FIG. 2 illustrates a portion of the electronic assembly 10. The electronic module 100 is coupled to a host circuit board 12 of the electronic assembly 10, such as for data and/or power transfer between the electronic module 100 and the host circuit board 12. Pluggable modules 50 of the electronic assembly 10 are coupled to the electronic module 100, such as for data and/or power transfer between the pluggable modules 50 and the electronic module 100. FIG. 2 shows one of the pluggable modules 50 poised for coupling to the electronic module 100.

In an exemplary embodiment, the electronic module 100 includes a plurality of socket assemblies 110 coupled to a module substrate 102. The electronic module 100 includes an electronic package 104 coupled to the module substrate 102. In the illustrated embodiment, the electronic module 100 includes a plurality of the socket assemblies 110 arranged around the electronic package 104, such as on all four sides of the electronic package 104, to electrically connect a plurality of the pluggable modules 50 to the electronic package 104. For example, the module substrate 102 includes circuits, traces, vias, pads or other conductors to electrically connect the socket assemblies 110 to the electronic package 104. The electronic package 104 may be a central processing unit (CPU), a microprocessor, a memory module, an integrated circuit, a chip, a network switch or the like. Optionally, multiple electronic devices, or other types of components, may be mounted to the module substrate 102. The electronic package 104 may be soldered directly to contacts on the module substrate 102. Alternatively, the electronic package 104 may be coupled to the module substrate through an interposer or socket connector.

During assembly, the pluggable modules 50 are plugged into the corresponding socket assemblies 110 to electrically connect the pluggable modules 50 to the electronic package 104. In various embodiments, the pluggable modules 50 may be high speed cable connectors. In other various embodiments, the pluggable modules 50 may be fiber optic transceivers. Optionally, both high speed cable connectors and fiber optic transceivers may be coupled to the module substrate 102 through corresponding socket assemblies 110. The pluggable modules 50 may include circuit boards 52 having contact pads (not shown) configured to be mated with the socket assemblies 110 via separable mating interfaces. The circuit board 52 may be held by a housing 54. Cables 56 or optical fibers 58 may extend from the housing 54 to another device or component. A separate device, such as a pluggable module holder or heat sink (not shown), may be used to press and hold the pluggable modules 50 downward to electrically connect the pluggable modules to the socket assemblies 110. The heat sink may be coupled to the tops of the pluggable modules 50 to dissipate heat from the pluggable modules 50.

In the illustrated embodiment, the electronic package 104 is an application specific integrated circuit (ASIC). The socket assemblies 110 are mounted to the module substrate 102, such as at the top surface, to allow connection of the pluggable modules 50 directly to the module substrate 102 for electrical connection to the electronic package 104. In an exemplary embodiment, the electronic package 104 is electrically connect to the host circuit board 12 through the module substrate 102.

The socket assembly 110 includes a socket housing 112 holding a plurality of socket contacts 120. In the illustrated embodiment, the socket housing 112 is a multi-piece housing including a socket frame 114 and a contact holder 124 held by the socket frame 114. The contact holder 124 holds the contacts 120 relative to the socket frame 114. The socket frame 114 is configured to be mounted to the module substrate 102. Optionally, the socket frame 114 includes frame members 116 forming a socket opening 118 that receives the pluggable module 50. The frame members 116 locate the pluggable module 50 in the socket opening 118. The socket frame 114 is configured to be coupled to the module substrate 102. The socket frame 114 may operate as an anti-overstress load bearing member that stops or limits compression of the socket assembly 110 (such as contacts of the socket assembly 110) when the electronic assembly 10 is assembled. In various embodiments, the socket frame 114 may at least partially surround the perimeter of the socket opening 118. Optionally, the socket frame 114 may have separate components provided at predetermined portions, such as at corners, of the socket assembly 110. In an alternative embodiment, the socket housing 112 may be a single piece housing having a frame structure that holds the socket contacts 120. For example, the frame structure may be a molded frame structure having the socket contacts loaded or stitched into the frame structure.

In an exemplary embodiment, the socket assembly 110 includes a plurality of socket contacts 120 (FIG. 2) arranged in and held in a contact array 122. The contacts 120 within the contact array 122 are arranged in predetermined patterns, such as in rows and columns. In an exemplary embodiment, the socket contacts 120 are compressible contacts. For example, the socket contacts 120 may be conductive elastomeric columns or metalized particle interconnects. In other various embodiments, the socket contacts 120 may be stamped and formed contacts. The socket contacts 120 may form a compressible, separable interface with the pluggable module 50. For example, the pluggable module 50 has a mating interface having a plurality of the contact pads (not shown in FIG. 1) that engage the socket contacts 120. The socket contacts 120 may from a compressible, separable interface with the module substrate 102. For example, the module substrate 102 has a mating interface having a plurality of the contact pads (not shown in FIG. 1) that engage the socket contacts 120.

In an exemplary embodiment, the socket assembly 110 includes a contact holder 124 holding the socket contacts 120. The contact holder 124 is coupled to the socket frame 114 and held by the socket frame 114 in the socket opening 118. The contact holder 124 holds the socket contacts 120 arrayed together, such as in a 25×25 array, 100×100 arrays, or other size. The contact holder 124 may be a dielectric film. The contact holder 124 may be formed in place on the socket contacts 120, such as being molded in place to hold the socket contacts 120.

In an exemplary embodiment, the socket assembly 110 includes guide pins 200 coupled to the module substrate 102. The guide pins 200 locate the socket assembly 110 relative to the module substrate 102 and the electronic package 104. In an exemplary embodiment, the guide pins 200 are surface mounted to locating pads on the module substrate 102 to mechanically fix the guide pins 200 to the module substrate 102. For example, the guide pins 200 may be soldered to the locating pads. In other various embodiments, the guide pins 200 may be secured using conductive epoxy or conductive adhesive. The locating pads can be accurately located on the surface of the module substrate 102, which allows for accurate positioning of the guide pins 200 on the module substrate 102. The guide pins 200 are surface mounted to the module substrate 102 to avoid using holes or vias through the module substrate 102, which allows additional space for circuit routing through the layers of the module substrate 102.

Figure 3:
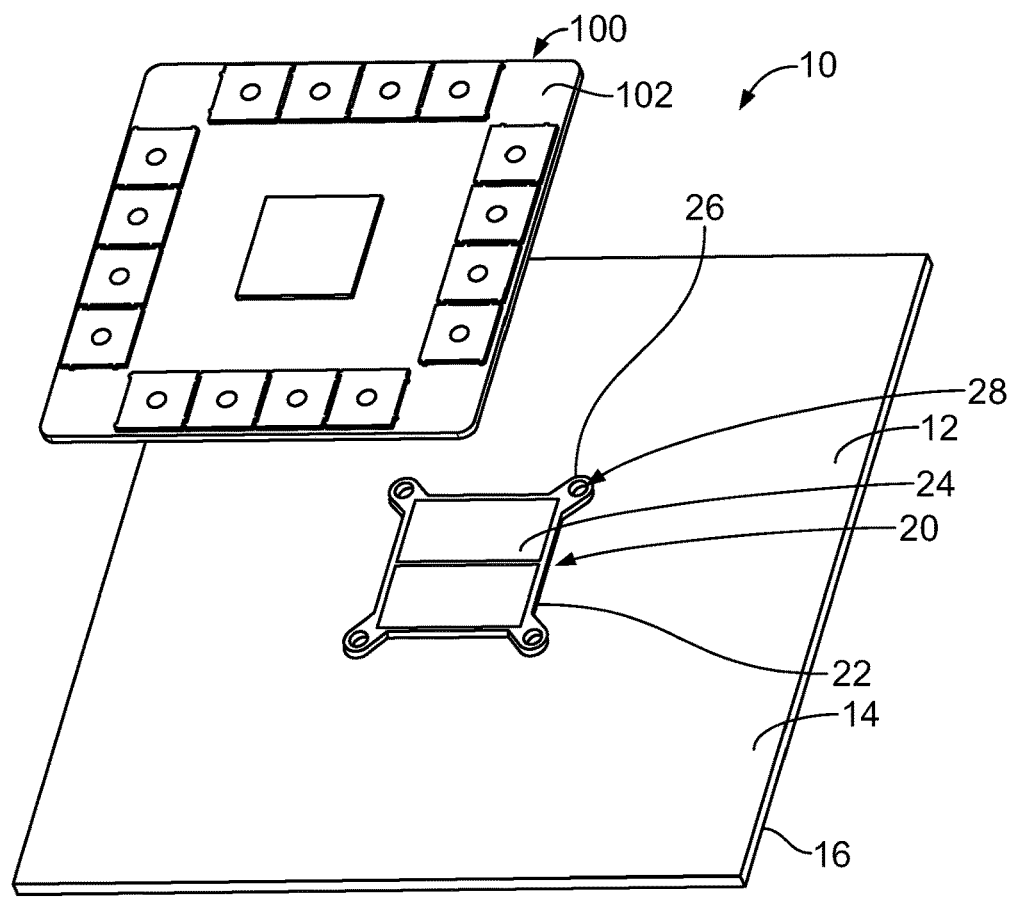
FIG. 3 is a top perspective view of the electronic assembly showing the electronic module poised for coupling to the host circuit board in accordance with an exemplary embodiment.
Figure 4:
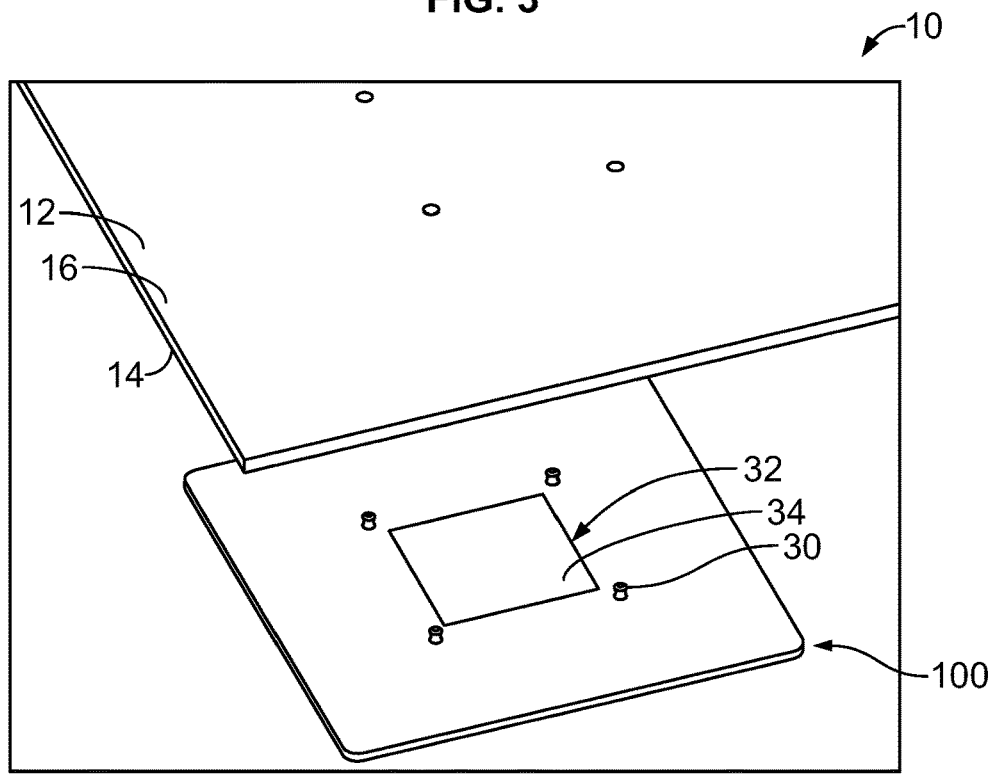
FIG. 4 is a bottom perspective view of the electronic assembly showing the electronic module poised for coupling to the host circuit board in accordance with an exemplary embodiment.

FIG. 3 is a top perspective view of the electronic assembly 10 showing the electronic module 100 poised for coupling to the host circuit board 12. FIG. 4 is a bottom perspective view of the electronic assembly 10 showing the electronic module 100 poised for coupling to the host circuit board 12.

The host circuit board 12 includes a substrate extending between an upper surface 14 and a lower surface 16. The host circuit board 12 includes board contacts (not shown) on the upper surface 14. A socket connector 20 is coupled to the upper surface 14 of the host circuit board 12. The socket connector 20 is electrically connected to the board contacts of the host circuit board 12.

The socket connector 20 includes a connector housing 22 holding connector contacts 24. The connector contacts 24 are configured to be electrically connected to corresponding board contacts of the host circuit board 12. In an exemplary embodiment, the connector contacts 24 are stamped and formed contacts having spring beams at upper ends of the connector contacts 24 forming a mating interface for mating with the electronic module 100. The connector contacts 24 may include spring beams at lower ends of the connector contacts 24 configured to be mated with the board contacts. In alternative embodiments, the connector contacts 24 may include solder pads and/or solder balls configured to be soldered to the board contacts. The connector contacts 24 may include signal contacts and/or ground contacts and/or power contacts.

In an exemplary embodiment, the socket connector 20 includes mounting tabs 26 having guide openings 28. Optionally, mounting hardware may be coupled to the mounting tabs 26 to secure the socket connector 20 to the host circuit board 12. For example, the mounting hardware may be received in the guide openings 28.

In an exemplary embodiment, the electronic module 100 is coupled to the socket connector 20 at the mounting tabs 26. In the illustrated embodiment, the electronic module 100 includes lower guide pins 30 (FIG. 4) extending from the bottom of the module substrate 102. The lower guide pins 30 are configured to be received in the guide openings 28. The lower guide pins 30 may be held in the guide openings 28 by an interference fit. In an exemplary embodiment, the lower guide pins 30 are surface mounted and attached to the bottom of the module substrate 102. For example, the lower guide pins 30 may be soldered to the module substrate 102. Other types of locating devices and/or securing devices may be used in alternative embodiments to mechanically connect the electronic module 100 to the socket connector 20. In the illustrated embodiment, the lower guide pins 30 are arranged around a pad array 32 of contact pads 34 at the bottom surface of the module substrate 102. The contact pads 34 are configured to be electrically connected to corresponding connector contacts 24. Optionally, the contact pads 34 may be approximately centered between the sides of the module substrate 102. The contact pads 34 may include signal contact pads and/or ground contact pads and/or power contact pads.

Figure 5:
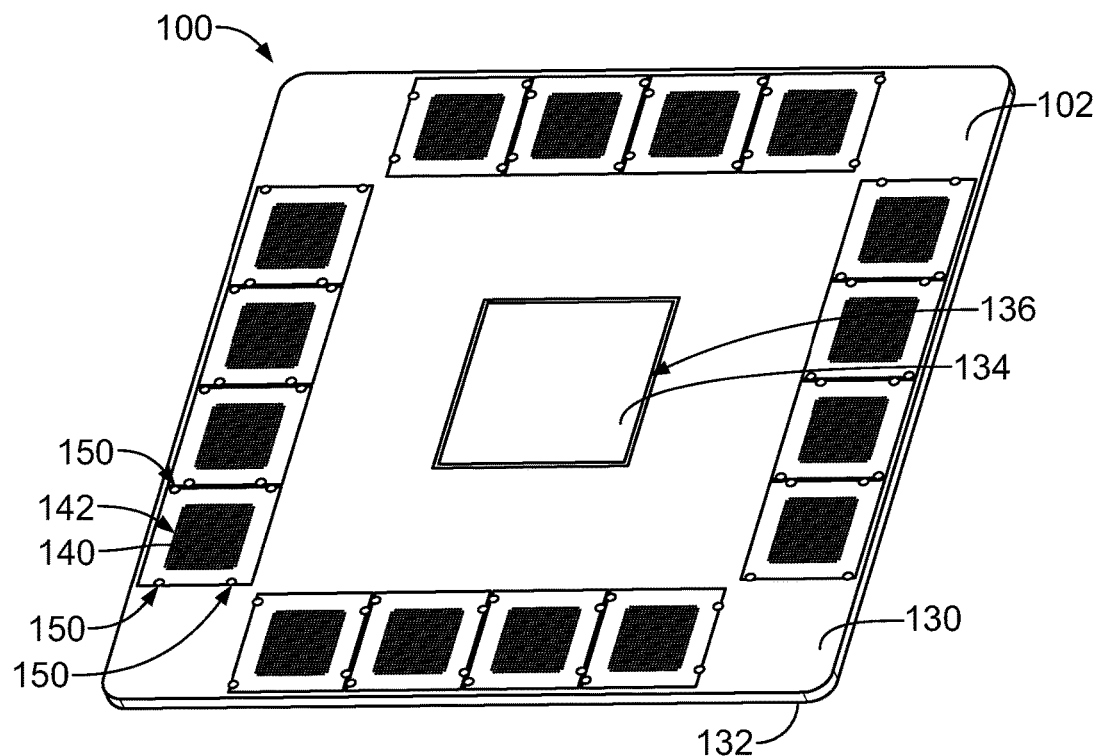
FIG. 5 is a top perspective view of a portion of the electronic module in accordance with an exemplary embodiment.

FIG. 5 is a top perspective view of a portion of the electronic module 100 in accordance with an exemplary embodiment. FIG. 5 shows the module substrate 102 with other components removed for clarity. The module substrate 102 has an upper surface 130 and a lower surface 132. Optionally, the module substrate 102 may be a multilayer substrate, such as a printed circuit board, having traces, vias, pads or other conductors on one or more layers of the substrate. In the illustrated embodiment, the module substrate 102 is generally rectangular having four sides. The module substrate 102 may have other shapes in alternative embodiments.

The module substrate 102 includes a plurality of the package contact pads 134 arranged in a package pad array 136 at the upper surface 130. The electronic package 104 (shown in FIG. 1) is configured to be coupled to the module substrate 102 at the package contact pads 134. For example, the electronic package 104 may be soldered to the package contact pads 134. In other various embodiments, an interposer or socket connector may be coupled to the package contact pads 134 and used to electrically connect the electronic package 104 to the module substrate 102.

The module substrate 102 includes a plurality of socket contact pads 140 arranged in one or more socket pad arrays 142 at the upper surface 130. The socket assemblies 110 (shown in FIG. 1) are configured to be coupled to the module substrate 102 at the socket pad arrays 142. For example, the socket assemblies 110 may be compression loaded against the socket contact pads 140 to electrically connect the socket assemblies 110 to the module substrate 102. In alternative embodiments, the socket assemblies 110 may be surface mounted to the socket contact pads 140, such as being soldered to the socket contact pads 140. In the illustrated embodiment, the socket pad arrays 142 surround the package pad array 136. For example, the socket pad arrays 142 are provided along all four sides of the module substrate 102. Optionally, the socket pad arrays 142 may be located proximate to the edges of the module substrate 102. Other locations are possible in alternative embodiments. Optionally, each of the socket pad arrays 142 may be identical (for example, include the same number of socket contact pads 140 in the rows and include the same number of socket contact pads 140 in the columns). Alternatively, one or more the socket pad arrays 142 may be different (for example, include a different number of socket contact pads 140 and/or a different pitch or spacing between the socket contact pads 140). In the illustrated embodiment, four socket pad arrays 142 are provided along each side of the module substrate 102 greater or fewer socket pad arrays 142 may be provided in alternative embodiments.

In an exemplary embodiment, the module substrate 102 includes a plurality of guide pin locating pads 150 at the upper surface 130. The guide pin locating pads 150 are associated with the socket pad arrays 142. For example, each socket pad array 142 includes at least one of the guide pin locating pads 150 positioned at predetermined locations relative to the socket contact pads 140. The guide pins 200 (shown in FIG. 2) are configured to be coupled to the guide pin locating pads 150. For example, the guide pins 200 may be surface mounted to the guide pin locating pads 150. In an exemplary embodiment, the guide pin locating pads 150 are formed during a printing process during manufacture of the module substrate 102. For example, the guide pin locating pads 150 may be printed during the same printing process used to form the socket contact pads 140. As such, the guide pin locating pads 150 may be accurately positioned (for example, X and Y spacing) relative to the socket contact pads 140 on the upper surface 130 of the module substrate 102. Thus, the guide pins 200 may be accurately located relative to the socket pad array 142 for locating the socket assembly 110. In the illustrated embodiment, the guide pin locating pads 150 are circular pads. The guide pin locating pads 150 may have other shapes in alternative embodiments.

In an exemplary embodiment, multiple guide pin locating pads 150 are located on opposite sides of the socket pad arrays 142. The guide pin locating pads 150 may be located near the four corners. Greater or fewer guide pin locating pads 150 may be used in alternative embodiments. Optionally, the guide pin locating pads 150 may be offset (for example, in the X and/or Y direction) on opposite sides of the socket pad array 142 to allow tighter spacing of the guide pins 200 between the socket pad arrays 142. For example, the guide pin locating pads 150 on one side of the socket pad array 142 may be widely spaced and the guide pin locating pads 150 on the other side of the socket pad array 142 may be narrowly spaced such that the narrowly spaced guide pin locating pads 150 may sit between the widely spaced guide pin locating pads 150. Other arrangements are possible in alternative embodiments, such as having both guide pin locating pads 150 on one side shifted outward and having both guide pin locating pads 150 on the other side shifted inward.

Figure 6:
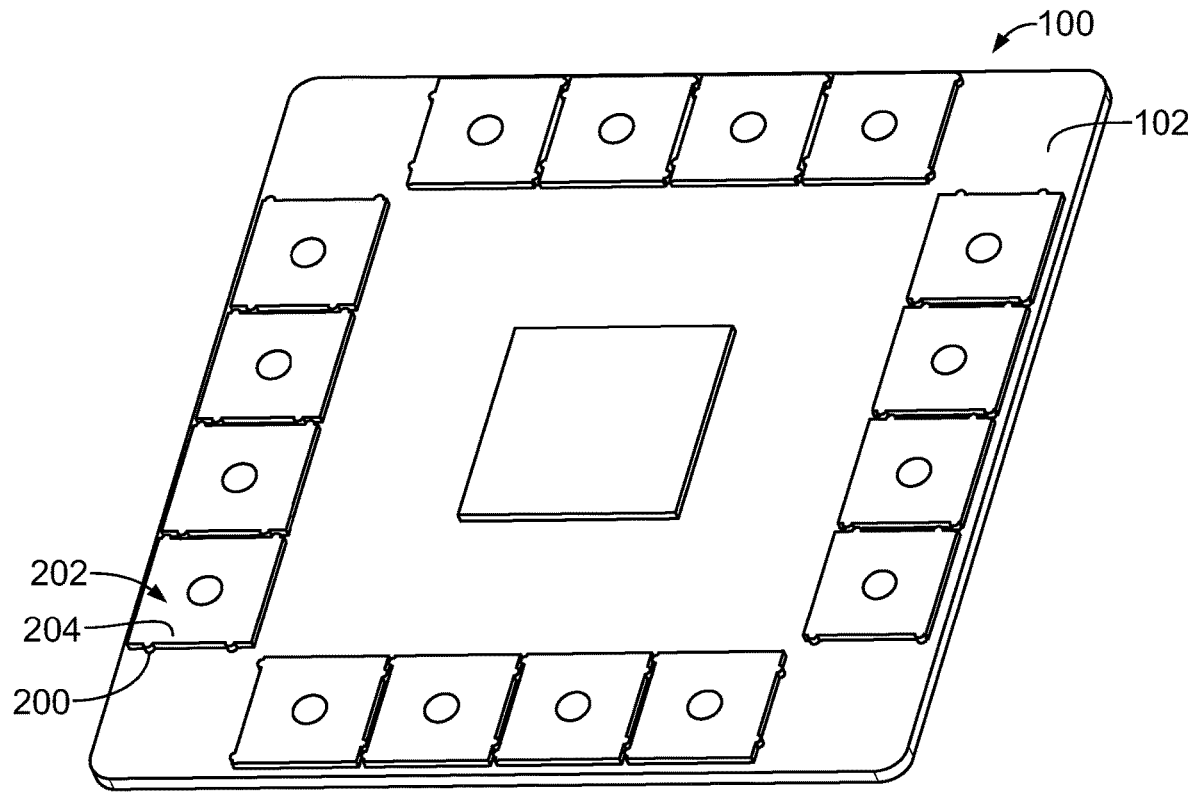
FIG. 6 is a top perspective view of a portion of the electronic module in accordance with an exemplary embodiment.

FIG. 6 is a top perspective view of a portion of the electronic module 100 in accordance with an exemplary embodiment. FIG. 6 illustrates the electronic module 100 with guide pin carrier assemblies 202 mounted to the module substrate 102. Each guide pin carrier assembly 202 includes a carrier 204, which holds a plurality of the guide pins 200. The carrier 204 is used to position the guide pins 200 on the module substrate 102. For example, the carrier 204 positions the guide pins 200 at the guide pin locating pads 150 (shown in FIG. 5). The carrier 204 is removable after the guide pins 200 are mounted to the module substrate 102. For example, the carrier 204 is removable after the guide pins 200 are surface mounted to the guide pin locating pads 150.

Figure 7:
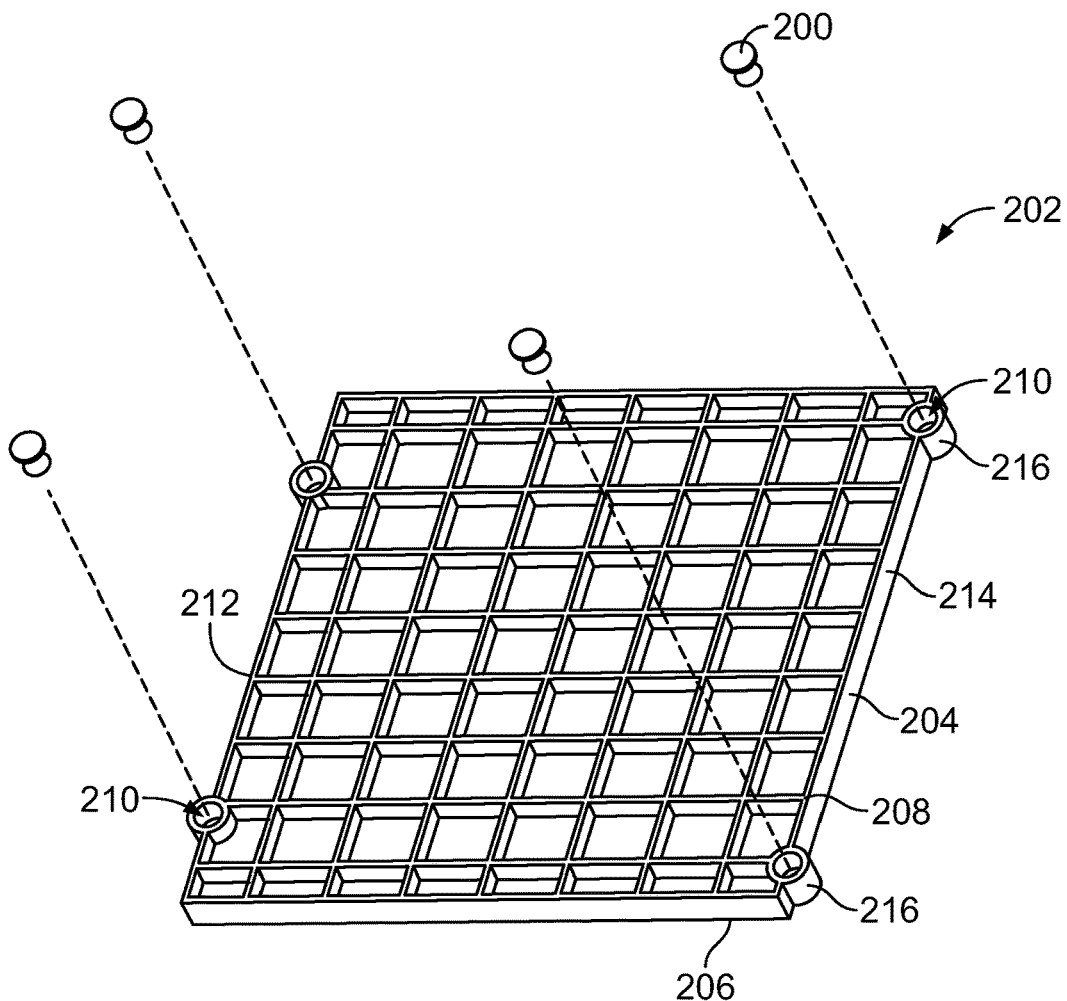
FIG. 7 is a bottom perspective view of the guide pin carrier assembly in accordance with an exemplary embodiment.
Figure 8:
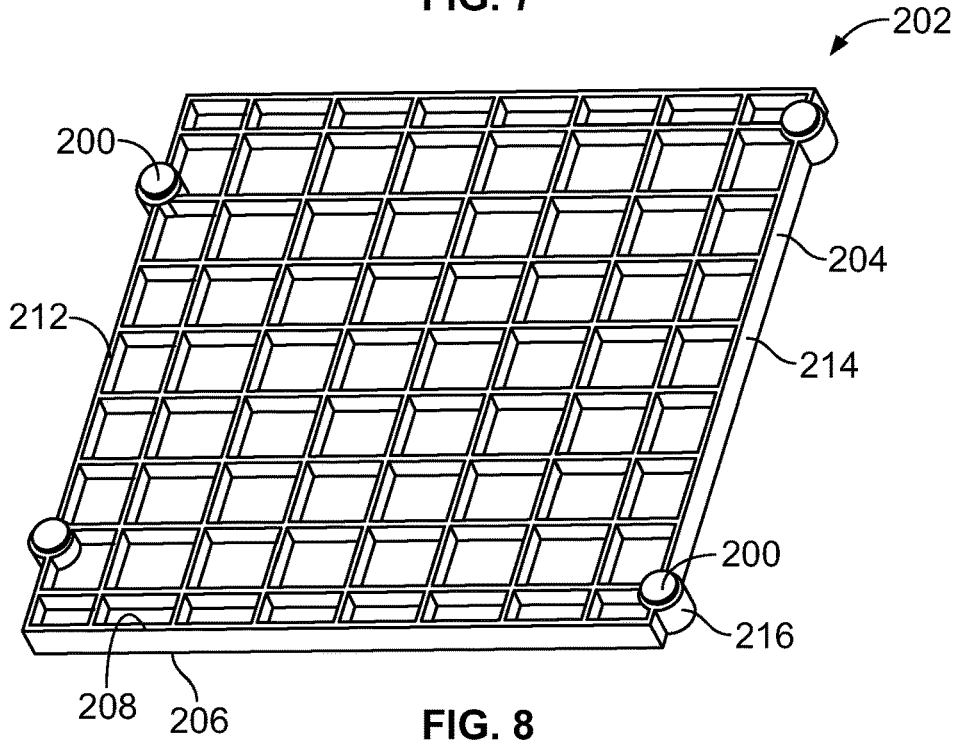
FIG. 8 is a bottom perspective view of the guide pin carrier assembly in accordance with an exemplary embodiment.

FIG. 7 is a bottom perspective view of the guide pin carrier assembly 202 in accordance with an exemplary embodiment showing the guide pins 200 exploded from the carrier 204. FIG. 8 is a bottom perspective view of the guide pin carrier assembly 202 in accordance with an exemplary embodiment showing the guide pins 200 coupled to the carrier 204. In an exemplary embodiment, the guide pins 200 may be press-fit into the carrier 204. For example, the guide pins 200 may be held by an interference fit in the carrier 204. The carrier 204 is removable from the guide pins 200 after the guide pins 200 are surface mounted to the guide pin locating pads 150 (shown in FIG. 5).

The carrier 204 is a rigid structure having a top 206 and a bottom 208. In an exemplary embodiment, the carrier 204 is manufactured from a plastic material. For example, the carrier 204 may be a molded part. The carrier 204 includes guide pin pockets 210 at predetermined locations. The guide pin pockets 210 are open at the bottom 208 to receive the guide pins 200. In an exemplary embodiment, the guide pin pockets 210 are provided at a first side 212 and the second side 214 opposite the first side 212. Optionally, multiple guide pin pockets 210 may be provided at the first side 212 and/or at the second side 214. The guide pin pockets 210 may be located proximate to the corners of the carrier 204. In an exemplary embodiment, the guide pin pockets 210 are formed in part by shrouds 216 that bump outward from the sides 212, 214. As such, the guide pin pockets 210 at least partially sit outward of the sides 212, 214, which allows tight stacking of the carriers 204 with the adjacent carriers 204 (see FIG. 6). For example, the shrouds 216 may be nested within the space defined by the shrouds 216 of the adjacent carrier 204.

The guide pin pockets 210 are provided at precise locations (for example, X and Y spacing) corresponding to the locations (for example, X and Y spacing) of the guide pin locating pads 150. Optionally, the guide pin pockets 210 may be offset (for example, in the X and/or Y direction) on the opposite sides 212, 214 to allow tighter spacing of the carrier 204 relative to adjacent carrier 204 (see FIG. 6). For example, the spacing between the guide pin pockets 210 on the first side 212 may be wide while the spacing between the guide pin pockets 210 on the second side 214 may be narrow such that the narrowly spaced guide pin pockets 210 may sit between the widely spaced guide pin pockets 210. Other arrangements are possible in alternative embodiments.

Figure 9:
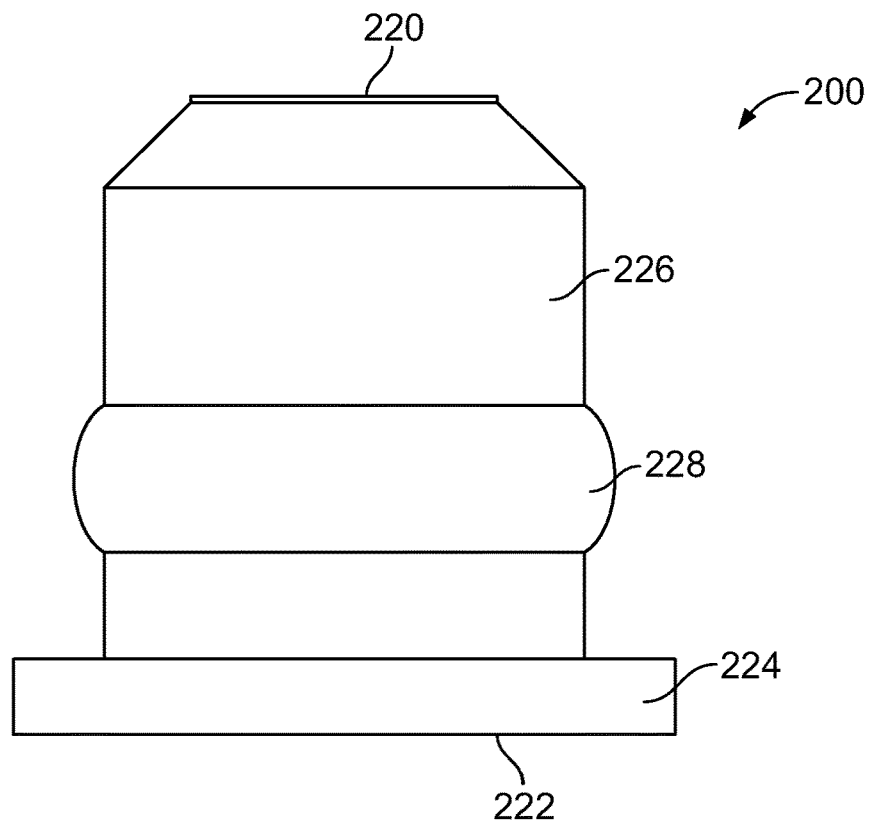
FIG. 9 is a side view of the guide pin in accordance with an exemplary embodiment.
Figure 10:
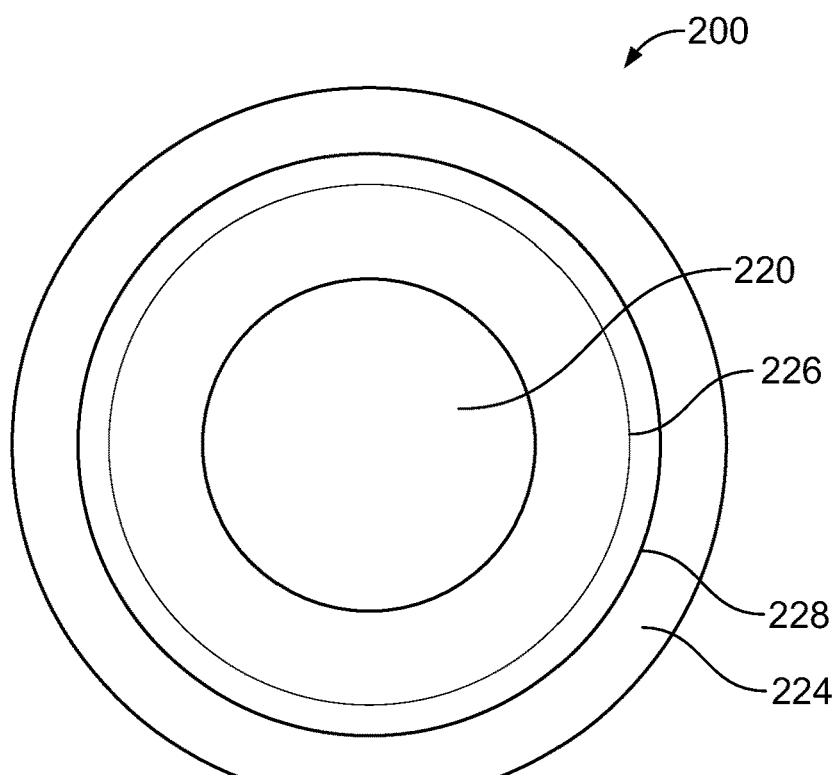
FIG. 10 is a top view of the guide pin in accordance with an exemplary embodiment.

FIG. 9 is a side view of the guide pin 200 in accordance with an exemplary embodiment. FIG. 10 is a top view of the guide pin 200 in accordance with an exemplary embodiment. In an exemplary embodiment, the guide pin 200 is manufactured from a metal material, which is configured to be soldered to the module substrate 102 (shown in FIG. 5). For example, solder paste or a solder ball may be soldered between the guide pin 200 and the guide pin locating pad 150 of the module substrate 102 to mechanically fix the guide pin 200 to the module substrate 102 at the guide pin located pad 150. Alternately, the guide pin 200 may be mechanically fixed to the module substrate 102 using epoxy or other adhesive materials.

The guide pin 200 extends between a top 220 and a bottom 222. The guide pin 200 includes a base 224 at the bottom 222 and a head 226 extending from the base 224 to the top 220. Optionally, the base 224 may be generally flat. The base 224 is configured to be surface mounted to the guide pin locating pad 150, such as using solder paste or a solder ball. Optionally, the head 226 may be tapered at the top 220. In the illustrated embodiment, the guide pin 200 has a generally circular cross-section. For example, the base 224 may be disc shaped and the head 226 may be generally cylindrical. Optionally, the guide pin 200 may include a bulge 228 along the head 226. The bulge 228 is an area having an increased diameter. The bulge 228 is used to provide an interference fit to hold the guide pin 200 in the carrier 204 (shown in FIG. 7) and/or to secure the socket assembly 110 to the guide pin 200. The guide pin 200 may have other shapes in alternative embodiments.

FIG. 11 is a top perspective view of a portion of the electronic module 100 in accordance with an exemplary embodiment showing one of the carriers 204 removed from the module substrate 102. During manufacture, the carrier 204 is used to position the guide pins 200 relative to the module substrate 102. For example, the guide pin carrier assembly 202 may be manufactured using a pick-and-place automated assembly process to precisely locate the guide pin carrier assembly 202 relative to the module substrate 102. The carrier 204 positions the guide pins 200 relative to the guide pin locating pads 150. The guide pins 200 may be soldered to the guide pin locating pads 150 during manufacture, such as during the soldering of other components to the module substrate 102, such as the electronic package 104 or other electronic devices. After the guide pins 200 are surface mounted to the module substrate 102 the carrier 204 may be removed and discarded. The guide pins 200 remain attached to the module substrate 102 after the carrier 204 is removed to receive the socket assembly 110 (shown in FIG. 12).

Figure 13:
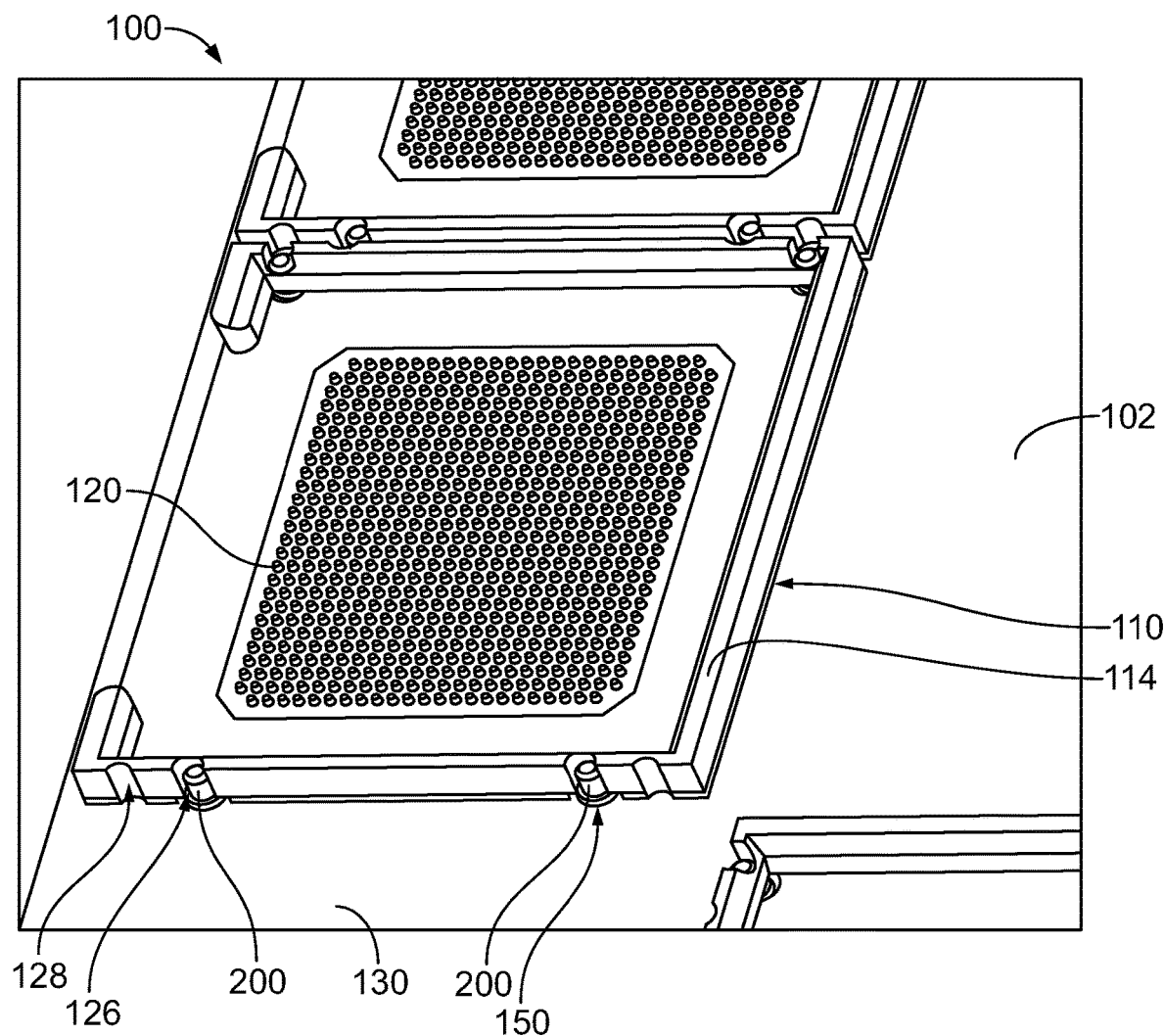
FIG. 13 is a top perspective view of a portion of the electronic module in accordance with an exemplary embodiment.

FIG. 12 is a top perspective view of a portion of the electronic module 100 in accordance with an exemplary embodiment showing one of the socket assemblies 110 poised for mounting to the module substrate 102. FIG. 13 is a top perspective view of a portion of the electronic module 100 in accordance with an exemplary embodiment showing a plurality of the socket assemblies 110 coupled to the module substrate 102.

During assembly, the socket assembly 110 is aligned with the guide pins 200 surface mounted to the module substrate 102 at the guide pin locating pads 150. The socket assembly 110 may be assembled using a pick-and-place automated assembly process to locate the socket assembly 110 relative to the guide pins 200 and lower the socket assembly 110 into position on the guide pins 200.

In an exemplary embodiment, the socket housing 112 includes guide pin pockets 126. For example, the guide pin pockets 126 may be located along the sides of the socket frame 114. The guide pin pockets 126 receive the guide pins 200 to locate the socket assembly 110 relative to the socket pad array 142. The socket contacts 120 are aligned with the corresponding socket contact pads 140 by the guide pins 200. Optionally, the socket frame 114 may include relief pockets 128 along the sides that receive portions of the guide pins 200 associated with the adjacent socket pad array 142. For example, the guide pins 200 associated with the adjacent socket pad array's 142 may be at least partially overlapping. The relief pockets 128 receive the adjacent guide pins 200 to allow tight spacing of the socket assemblies 110 along the upper surface 130 of the module substrate 102.

Figure 14:
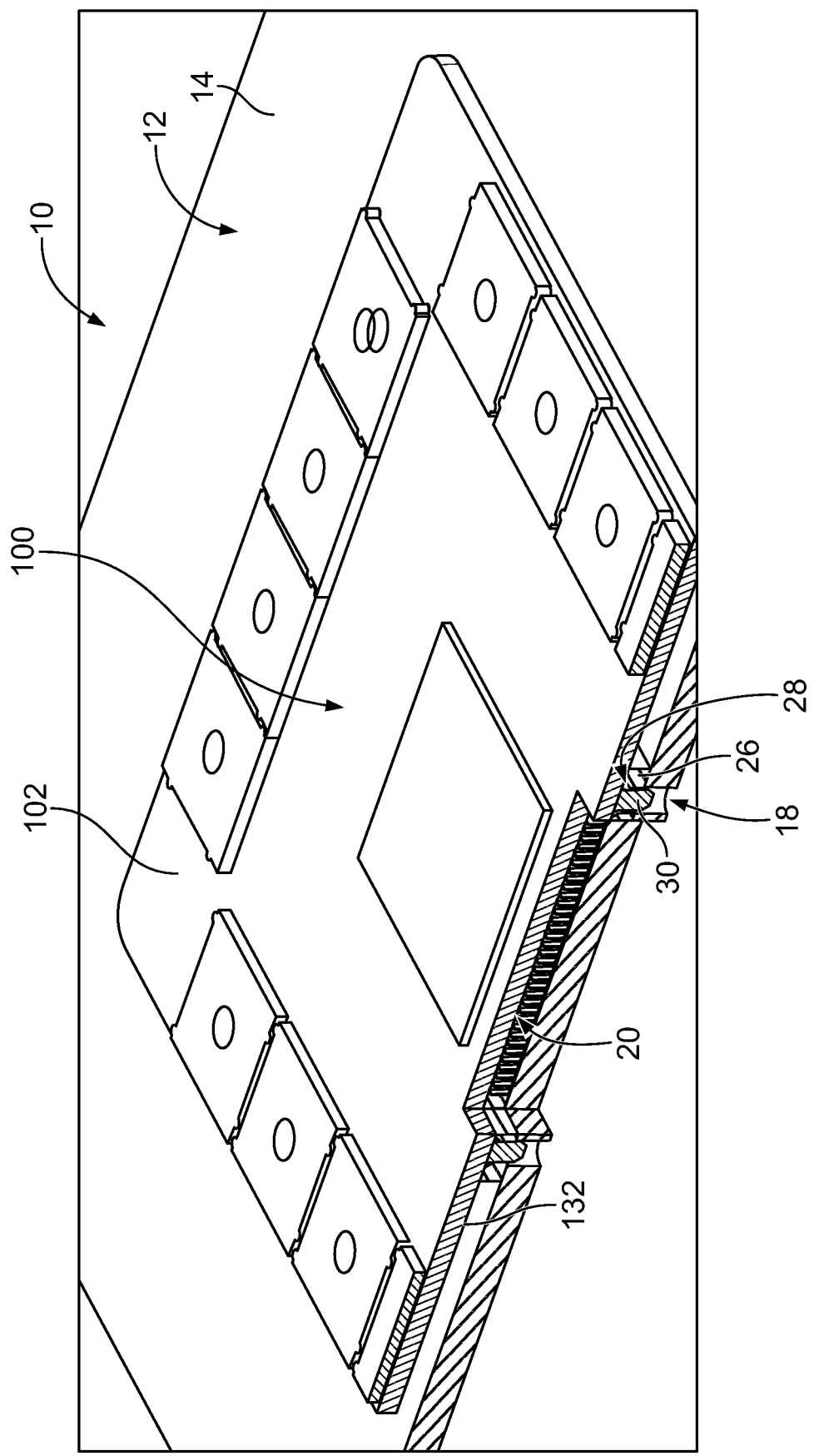
FIG. 14 is a sectional view of the electronic assembly in accordance with an exemplary embodiment.
Figure 15:
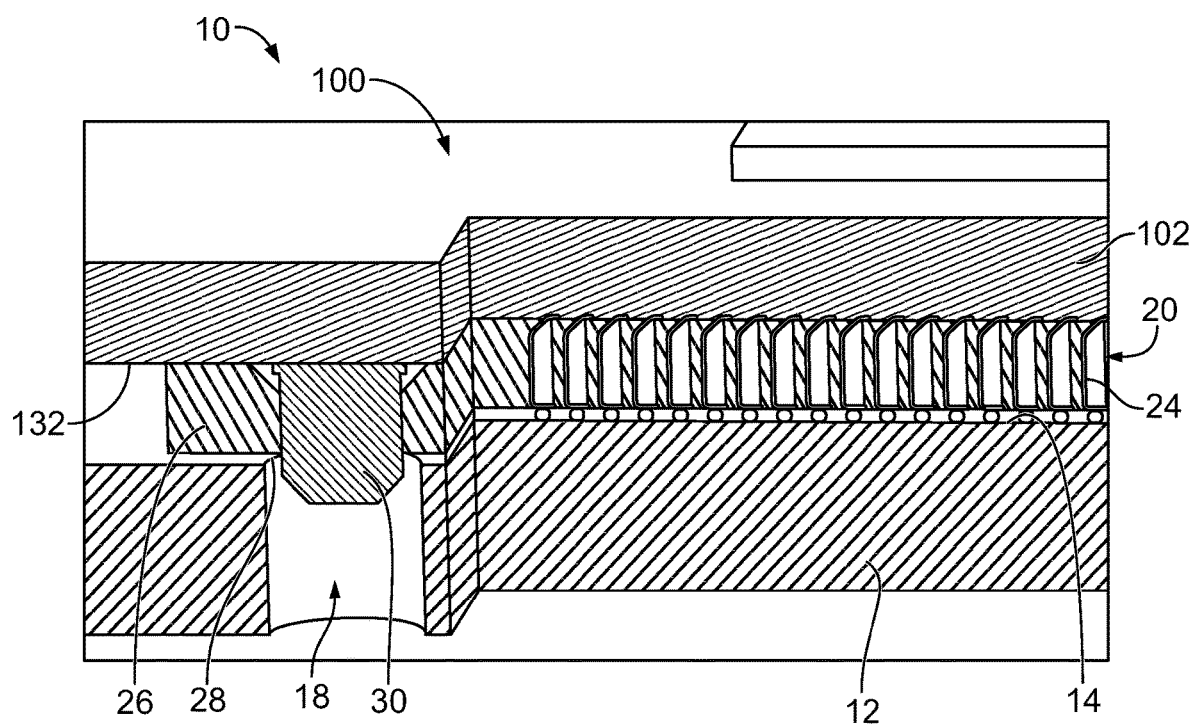
FIG. 15 is a sectional view of a portion of the electronic assembly showing the electronic module coupled to the socket connector on the host circuit board in accordance with an exemplary embodiment.

FIG. 14 is a sectional view of the electronic assembly 10 in accordance with an exemplary embodiment. FIG. 15 is a sectional view of a portion of the electronic assembly 10 showing the electronic module 100 coupled to the socket connector 20 on the host circuit board 12. During assembly, the connector contacts 24 of the socket connector 20 are coupled to the host circuit board 12. For example, the connector contacts 24 are soldered to the board contacts of the host circuit board 12. The connector contacts 24 are configured to interface with the contact pads 34 at the lower surface 132 of the module substrate 102 to electrically connect the electronic module 100 with the host circuit board 12.

During assembly, the lower guide pins 30 of the electronic module 100 are received in the guide openings 28 in the mounting tabs 26 of the socket connector 20. The lower guide pins 30 position the electronic module 100 relative to the socket connector 20, such as to align the contact pads 34 with the connector contacts 24. If the lower guide pins 30 are misaligned relative to the guide openings 28, the electronic module 100 is unable to connect with the socket connector 20. For example, the module substrate 102 is unable to be lowered into physical contact with the connector contacts 24, thus preventing electrical shorting and/or damage to the connector contacts 24. In an exemplary embodiment, the lower guide pins 30 have a height that is greater than the height of the connector housing 22. The guide openings 28 are aligned with openings 18 in the host circuit board 12. The ends of the lower guide pins 30 pass through the connector housing 22 into the openings 18 and the host circuit board 12 if the socket connector 20 is misaligned relative to the host circuit board 12 and the guide openings 28 are misaligned relative to the openings 18. Such misalignment causes the lower guide pins 30 to bottom out on the upper surface 14 of the host circuit board 12, preventing mating of the electronic module 100 with the socket connector 20. As such, the lower guide pins 30 as well as the openings 18, 28 provide position assurance of the assembly.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electronic module comprising:
a module substrate having an upper surface and a lower surface, the module substrate having a package pad array having package contact pads at the upper surface, the module substrate having a socket pad array having socket contact pads at the upper surface, the module substrate having guide pin locating pads associated with the socket pad array;
an electronic package coupled to the package contact pads at the package pad array;
guide pins surface mounted to the guide pin locating pads; and
a socket assembly coupled to the module substrate, the socket assembly having a socket housing holding socket contacts, the socket contacts being coupled to the socket contact pads at the socket pad array, the socket housing including pockets receiving the guide pins to locate the socket assembly relative to the module substrate.

2. The electronic module of claim 1, wherein the guide pins are soldered to the guide pin locating pads of the module substrate at soldered joints.

3. The electronic module of claim 1, wherein the guide pins are located on opposite sides of the socket pad array.

4. The electronic module of claim 1, wherein each guide pin includes a base and a post extending from the base, the base being surface mounted to the corresponding guide pin locating pad at a solder joint, the posts being received in the corresponding pocket to locate the socket assembly relative to the module substrate.

5. The electronic module of claim 1, wherein the guide pin is secured to the module substrate without an opening in the module substrate.

6. The electronic module of claim 1, wherein the socket housing includes a first side and a second side opposite the first side, the first side including at least one of the pockets, the second side including at least one of the pockets.

7. The electronic module of claim 6, wherein the at least one of the pockets on the first side are offset from the at least one of the pockets on the second side.

8. The electronic module of claim 1, further comprising a carrier having guide pin pockets at predetermined locations relative to each other corresponding to locations of the guide pin locating pads, the guide pins being received in the corresponding guide pin pockets, the guide pins being surface mounted to the guide pin locating pads while retained in the carrier, the carrier being removable from the guide pins after the guide pins are surface mounted to the guide pin locating pads to allow the socket assembly to be coupled to the module substrate over the guide pins.

9. The electronic module of claim 8, wherein the guide pins are secured to the carrier by an interference fit.

10. The electronic module of claim 8, wherein the carrier includes a top, a bottom, a first side, and a second side opposite the first side, the first side including at least guide pin pocket configured to receive the corresponding guide pin, the second side including at least one guide pin pocket configured to receive the corresponding guide pin, the guide pin pockets being open at the bottom to receive the guide pins.

11. The electronic module of claim 1, wherein the socket pad array is a first socket pad array, the module substrate having a second socket pad array adjacent the first socket pad array, the guide pin locating pads being first guide pin locating pads, the module substrate having second guide pin locating pads associated with the second pad array, the guide pins being first guide pins, the electronic module further comprising second guide pins surface mounted to the second guide pin locating pads, the socket assembly being a first socket assembly, the electronic module further comprising a second socket assembly coupled to the second guide pins surface mounted to the second guide pin locating pads to interface with the second socket pad array.

12. The electronic module of claim 11, further comprising a first carrier holding the first guide pins for soldering to the first guide pins locating pads and a second carrier holding the second guide pins for soldering to the second guide pin locating pads, the first carrier being removable from the first guide pins after the first guide pins are surface mounted to the first guide pin locating pads for mating the first socket assembly to the first guide pins, the second carrier being removable from the second guide pins after the second guide pins are surface mounted to the second guide pin locating pads for mating the second socket assembly to the second guide pins.

13. The electronic module of claim 1, wherein the socket contacts are coupled to the socket contact pads at a compressive interface, the socket contacts being separable from the socket contact pads at the compressive interface.

14. An electronic module comprising:
a module substrate having an upper surface and a lower surface, the module substrate having a package pad array having package contact pads at the upper surface, the module substrate having a socket pad array having socket contact pads at the upper surface, the module substrate having guide pin locating pads associated with the socket pad array;
an electronic package coupled to the package contact pads at the package pad array; and
a guide pin carrier assembly coupled to the module substrate, the guide pin carrier assembly including a carrier having guide pin pockets at predetermined locations relative to each other corresponding to locations of the guide pin locating pads, the guide pin carrier assembly including guide pins received in the corresponding guide pin pockets, the guide pins being surface mounted to the guide pin locating pads, wherein the carrier is removable from the guide pins after the guide pins are surface mounted to the guide pin locating pads.

15. The electronic module of claim 14, wherein the carrier includes a top, a bottom, a first side, and a second side opposite the first side, the first side including at least guide pin pocket configured to receive the corresponding guide pin, the second side including at least one guide pin pocket configured to receive the corresponding guide pin, the guide pin pockets being open at the bottom to receive the guide pins.

16. The electronic module of claim 14, further comprising a socket assembly coupled to the module substrate after the carrier is removed, the socket assembly having a socket frame having a socket opening configured to receive a pluggable module, the socket assembly having a contact holder coupled to the socket frame, the socket assembly having socket contacts held by the contact holder, the socket contacts being coupled to the socket contact pads at the socket pad array, the socket frame including pockets receiving the guide pins to locate the socket assembly relative to the module substrate.

17. The electronic module of claim 14, wherein each guide pin includes a base and a post extending from the base, the base being surface mounted to the corresponding guide pin locating pad at a joint, the posts being received in the corresponding pocket to locate the socket assembly relative to the module substrate.

18. An electronic assembly comprising:
a host circuit board having an upper surface and a lower surface, the host circuit board including board contacts on the upper surface;
a socket connector coupled to the host circuit board, the socket connector including a connector housing holding connector contacts, the connector contacts being coupled to the board contacts; and
an electronic module coupled to the socket connector, the electronic module comprising:
a module substrate having an upper surface and a lower surface, the module substrate having a package pad array having package contact pads at the upper surface, the module substrate having a socket pad array having socket contact pads at the upper surface, the module substrate having guide pin locating pads associated with the socket pad array;
an electronic package coupled to the package contact pads at the package pad array;
guide pins surface mounted to the guide pin locating pads; and
a socket assembly coupled to the module substrate, the socket assembly having a socket housing holding socket contacts, the socket contacts being coupled to the socket contact pads, the socket frame including pockets, the pockets receiving the guide pins to locate the socket assembly relative to the module substrate.

19. The electronic assembly of claim 18, wherein the socket connector contacts have spring beams coupled to substrate contacts of the module substrate at a compressible, separable interface.

20. The electronic assembly of claim 18, wherein the connector housing includes guide openings, the module substrate having lower guide pins surface mounted to mounting pads at the lower surface of the module substrate, the lower guide pins received in the corresponding guide openings to locate the module substrate relative to the connector housing.

\* \* \* \* \*